(12) United States Patent
Choy et al.

(10) Patent No.: US 7,580,288 B2
(45) Date of Patent: Aug. 25, 2009

(54) MULTI-LEVEL VOLTAGE ADJUSTMENT

(75) Inventors: Jon S. Choy, Austin, TX (US); Chen He, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 294 days.

(21) Appl. No.: 11/420,095

(22) Filed: May 24, 2006

(65) Prior Publication Data

US 2007/0274116 A1   Nov. 29, 2007

(51) Int. Cl.
*G11C 16/06* (2006.01)
*H03M 1/66* (2006.01)
*H03M 1/78* (2006.01)
*H03L 5/00* (2006.01)

(52) U.S. Cl. .................. 365/185.18; 341/144; 341/145; 341/154; 327/306; 327/308; 327/307; 365/185.23; 365/189.09

(58) Field of Classification Search ............ 365/185.18, 365/185.2, 185.23, 189.09, 189.11, 230.06; 341/144, 145, 146, 154; 327/306, 307, 308, 327/331, 333

See application file for complete search history.

(56) References Cited

U.S. PATENT DOCUMENTS

| | | | | |
|---|---|---|---|---|
| 3,997,892 A | * | 12/1976 | Susset | 341/136 |
| 4,491,825 A | * | 1/1985 | Tuthill | 341/145 |
| 5,165,099 A | * | 11/1992 | Onaya et al. | 381/1 |
| 5,523,721 A | * | 6/1996 | Segawa et al. | 330/86 |
| 5,675,546 A | * | 10/1997 | Leung | 365/201 |
| 6,226,200 B1 | | 5/2001 | Eguchi et al. | |
| 6,268,817 B1 | * | 7/2001 | Min et al. | 341/145 |
| 7,073,104 B1 | * | 7/2006 | Li et al. | 714/718 |
| 7,277,036 B2 | * | 10/2007 | Otake | 341/154 |
| 2003/0169114 A1 | * | 9/2003 | Manapragada et al. | 330/279 |
| 2005/0134363 A1 | | 6/2005 | Vorenkamp | |
| 2005/0174868 A1 | * | 8/2005 | Anzai et al. | 365/210 |

\* cited by examiner

*Primary Examiner*—J. H. Hur
(74) *Attorney, Agent, or Firm*—Susan C. Hill; David G. Dolezal

(57) ABSTRACT

An adjustable voltage supply (310) may have a plurality of levels of adjustment, such as a coarse select circuit (471) and a fine select circuit (473), to generate an adjustable voltage (e.g. Vout 364 of FIGS. 3 and 4) with fine resolution across a wide voltage range. In one embodiment, the adjustable voltage may be used as an adjustable read voltage to measure the threshold voltages of bitcells in a memory array (300). From the distribution of these threshold voltages, it is possible to determine the marginality of the bitcells with regard to the voltage which is required to read the bitcells. In one embodiment, the adjustable voltage supply (310) may also be used to provide an adjustable voltage to one or more integrated circuit pwells and/or nwells in order to apply electrical stress. An adjustable voltage supply (310) may be used in any desired context, not just memories.

15 Claims, 4 Drawing Sheets

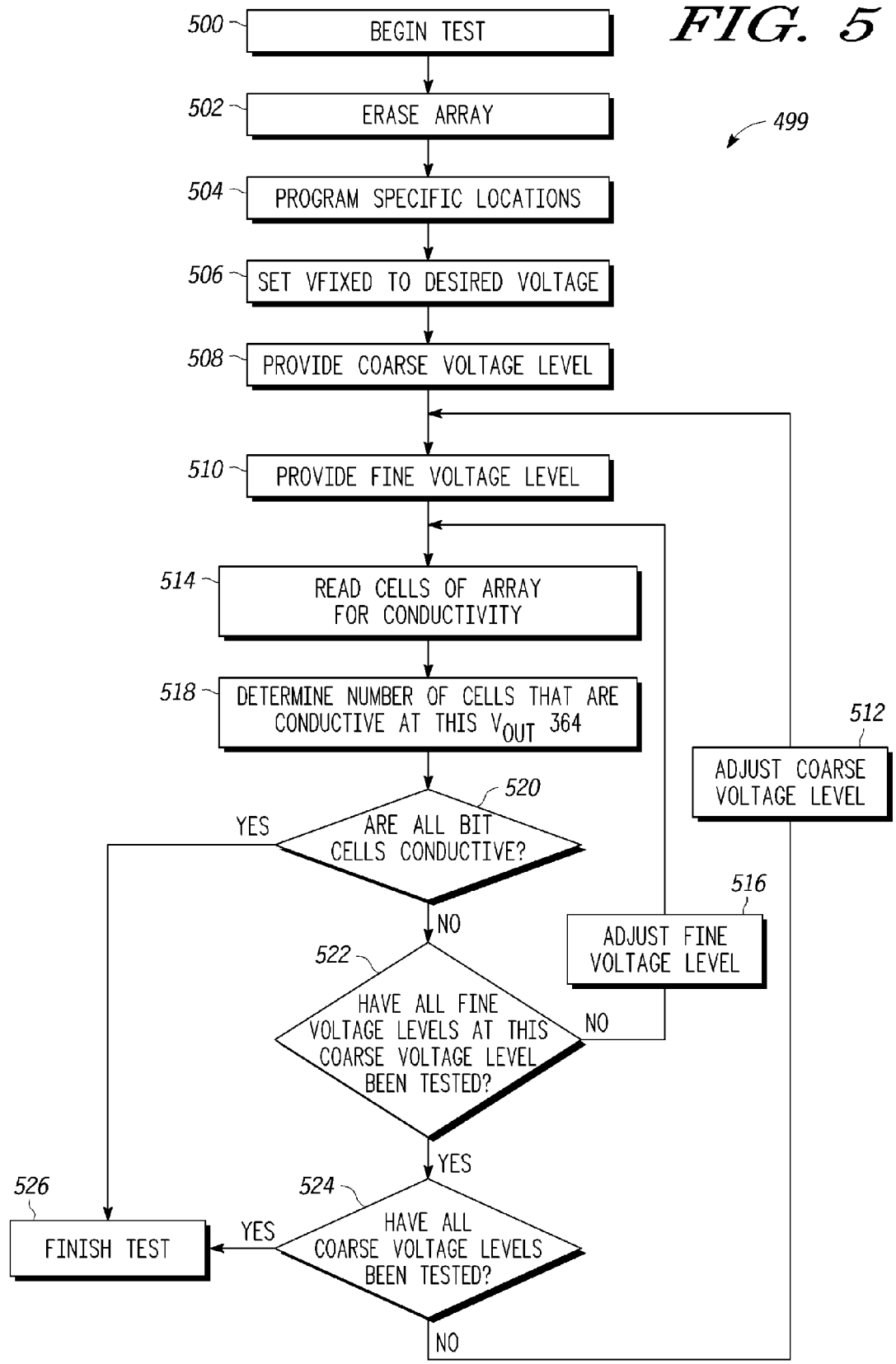

MULTI-LEVEL VOLTAGE ADJUSTMENT

FIELD OF THE INVENTION

The present invention relates generally to voltage adjustment, and more particularly to multi-level voltage adjustment.

RELATED ART

Voltage adjustment circuits have a variety of uses. One possible use is to aid in the determination of threshold voltages. For example, nonvolatile memories may require that the distribution of bitcell threshold voltages be determined in order to understand the marginality of the bitcells with regard to a read voltage. Another possible use of the voltage adjustment circuits is to provide an adjustable electrical stress to the bitcells in a memory array in order to test the robustness of the bitcells.

BRIEF DESCRIPTION OF THE DRAWINGS

The present invention is illustrated by way of example and not limited by the accompanying figures, in which like references indicate similar elements, and in which:

FIG. 5 illustrates, in flow diagram form, a method in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
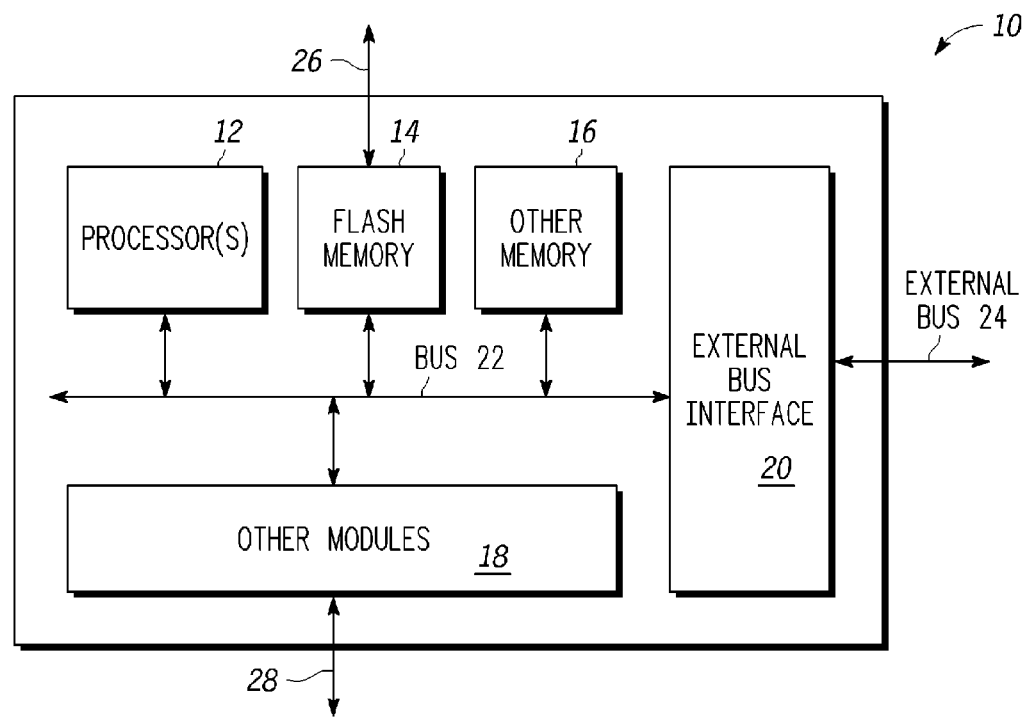
FIG. 1 illustrates, in block diagram form, an integrated circuit in accordance with one embodiment of the present invention.

FIG. 1 illustrates, in block diagram form, an integrated circuit 10 in accordance with one embodiment of the present invention. In the illustrated embodiment, integrated circuit (IC) 10 comprises one or more processors 12, one or more flash memories 14, one or more other memories 16, one or more other modules 18, and an external bus interface 20 which may be bi-directionally coupled by way of bus 22. Alternate embodiments may not have a processor 12, may not have other memory 16, may not have other modules 18, and/or may not have external bus interface 20. In the illustrated embodiment, external bus interface 20 is coupled to an external bus 24 which may be used to communicate information to and from IC 10. Flash memory 14 is coupled to one or more integrated circuit terminals 26 which may be used to communicate information between flash memory 16 and circuitry (not shown) that is external to IC 10. In one embodiment, an integrated circuit terminal 26 may be used to provide a fixed voltage (Vfixed 410) to flash memory 14. In alternate embodiments, this fixed voltage may be provided by way of external bus interface 20 and buses 22 and 24. In yet other embodiments, this fixed voltage may be provided by way of an input terminal 28 coupled to an input port in other modules 18. In alternate embodiments, one or more of modules 12, 16, and 18 may have one or more integrated circuit terminals (not shown) which may be used to communicate information to and/or from circuitry (not shown) that is external to IC 10. Note that in some embodiments, IC 10 may have only one or more flash memories 14.

Figure 2:
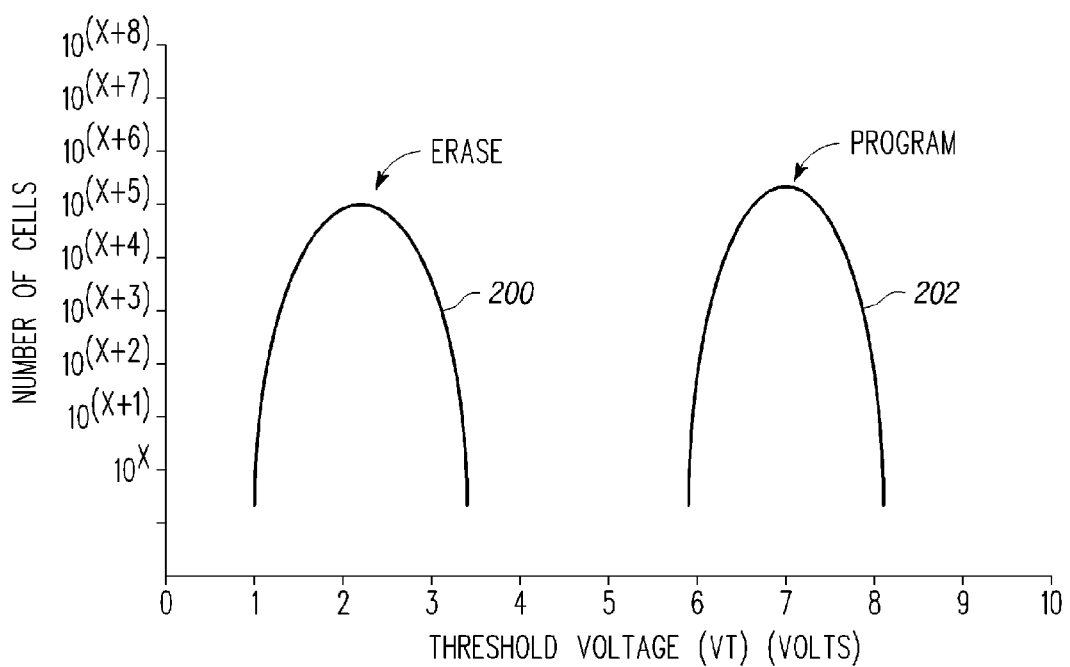
FIG. 2 illustrates, in graphical form, bitcell threshold voltage distributions for erased bitcells and for programmed bitcells in accordance with one embodiment of the present invention.

FIG. 2 illustrates, in graphical form, bitcell threshold voltage distributions for erased bitcells and for programmed bitcells in accordance with one embodiment of the present invention. In the illustrated graph, curve 200 shows the number of bitscells (see vertical axis) that have the specified threshold voltage (see horizontal axis) when the bitcells in array 300 (see FIG. 3) are erased. In the illustrated graph, curve 202 shows the number of bitscells (see vertical axis) that have the specified threshold voltage (see horizontal axis) when the bitcells in array 300 (see FIG. 3) are programmed. Note that the vertical axis uses a logarithmic scale. The gap between curve 200 and curve 202 indicates the marginality of the bitcells with regard to the voltage which is required to read the bitcells. Using the curves 200, 202, it is clear that the read voltage must be in the range of 3.5 volts to 5.8 volts. For most real world applications, a margin is added on both sides of this range to ensure that the bitcells are read accurately over a long period of time. Thus, the read voltage may be kept within a narrower range than of 3.5 volts to 5.8 volts. For example, the read voltage may be kept within a range of 4.3 volts to 4.5 volts.

Figure 3:
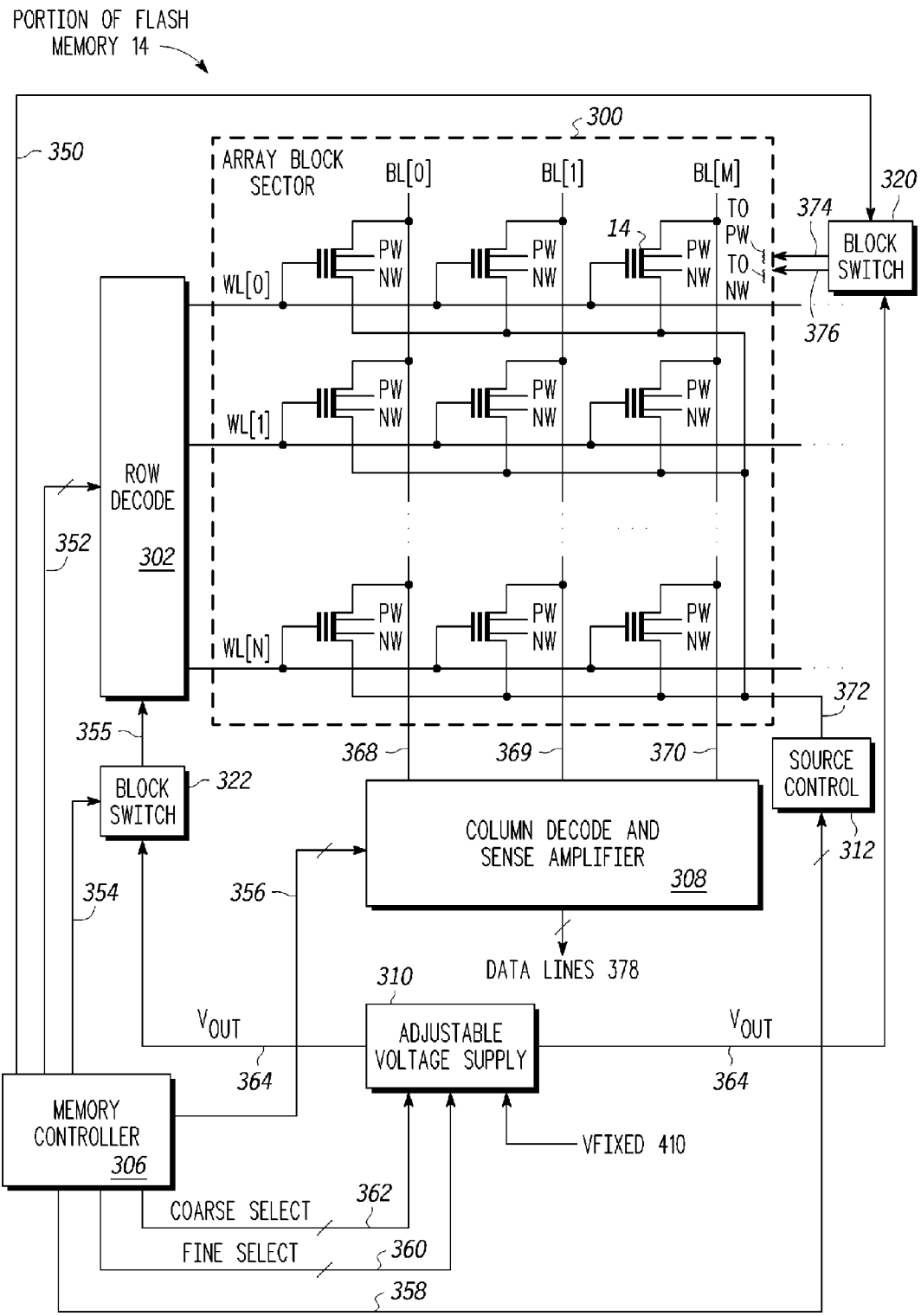
FIG. 3 illustrates, in block diagram form, a portion of flash memory 14 of FIG. 1 in accordance with one embodiment of the present invention.

FIG. 3 illustrates, in block diagram form, a portion of flash memory 14 of FIG. 1 in accordance with one embodiment of the present invention. In the illustrated embodiment, adjustable voltage supply circuit 310 may be used to provide an adjustable voltage (Vout 364) to the wordlines in order to facilitate the measurement of the threshold voltages (Vt) of the bitcells in array 300. In the illustrated embodiment, this is accomplished in the following manner. An adjustable voltage supply 310 applies a voltage Vout 364 to block switch 322. Block switch 322 receives a control signal 354 from memory controller 306. Block switch 322 uses control signal 354 to determine whether or not to provide Vout 355 to row decoder 302. Signals 352 are provided to row decoder 302 to select one row or wordline in bitcell array 300. Once a wordline is selected in this manner, memory controller 306 provides a plurality of column select signals 356 to column decode and sense amplifier circuit 308 in order select the desired column (s). Once the desired row and column is selected, current from the desired bitcells in array 300 is available at the inputs to sense amplifiers in circuit 308. These sense amplifiers in circuit 308 convert the received current to data values (data lines 378) that can be read as the values stored in the selected bitcells. Note that signals 368-370 provide the current from the bitcells to the sense amplifiers in circuit 308. Source control circuit 312 receives and uses a plurality of control signals 358 from the memory controller 306 to determine whether to float or ground the common source 372 for all of the bitcells in array 300.

In the illustrated embodiment, adjustable voltage supply circuit 310 may also be used to provide an adjustable voltage (Vout 364) to the isolated pwells (PWs) and nwells (NWs) in order to apply electrical stress to the bitcells in array 300. In the illustrated embodiment, this is accomplished in the following manner. An adjustable voltage supply 310 applies a voltage Vout 364 to block switch 320. Block switch 320 receives a control signal 350 from memory controller 306.

Block switch 320 uses control signal 350 to determine whether or not to provide the adjustable voltage Vout 374, 376 to wells in array 300. Note that adjustable voltage supply circuit 310 may also be used to provide an adjustable voltage to the selected wells in array 300 during erasure through the same path 374, 376 and using memory controller 306 to provide the correct control signals.

In the illustrated embodiment, memory controller 306 provides both a coarse select signal 362 and a fine select signal 360 to adjustable voltage supply circuit 310. The coarse select signal 362 selects a coarse voltage, which is used as the base of fine voltage, and then the fine select signal 360 selects a fine voltage as the output voltage Vout 364. In the illustrated embodiment, the maximum coarse voltage and the maximum fine voltage is determined by Vfixed 410. Adjustable voltage supply circuit 310 may internally generate the minimum coarse voltage, and the minimum fine voltage is determined by the selected coarse voltage. Although the illustrated embodiment only uses two levels of voltage adjustment, alternate embodiments may use any number of levels of voltage adjustment.

Figure 4:
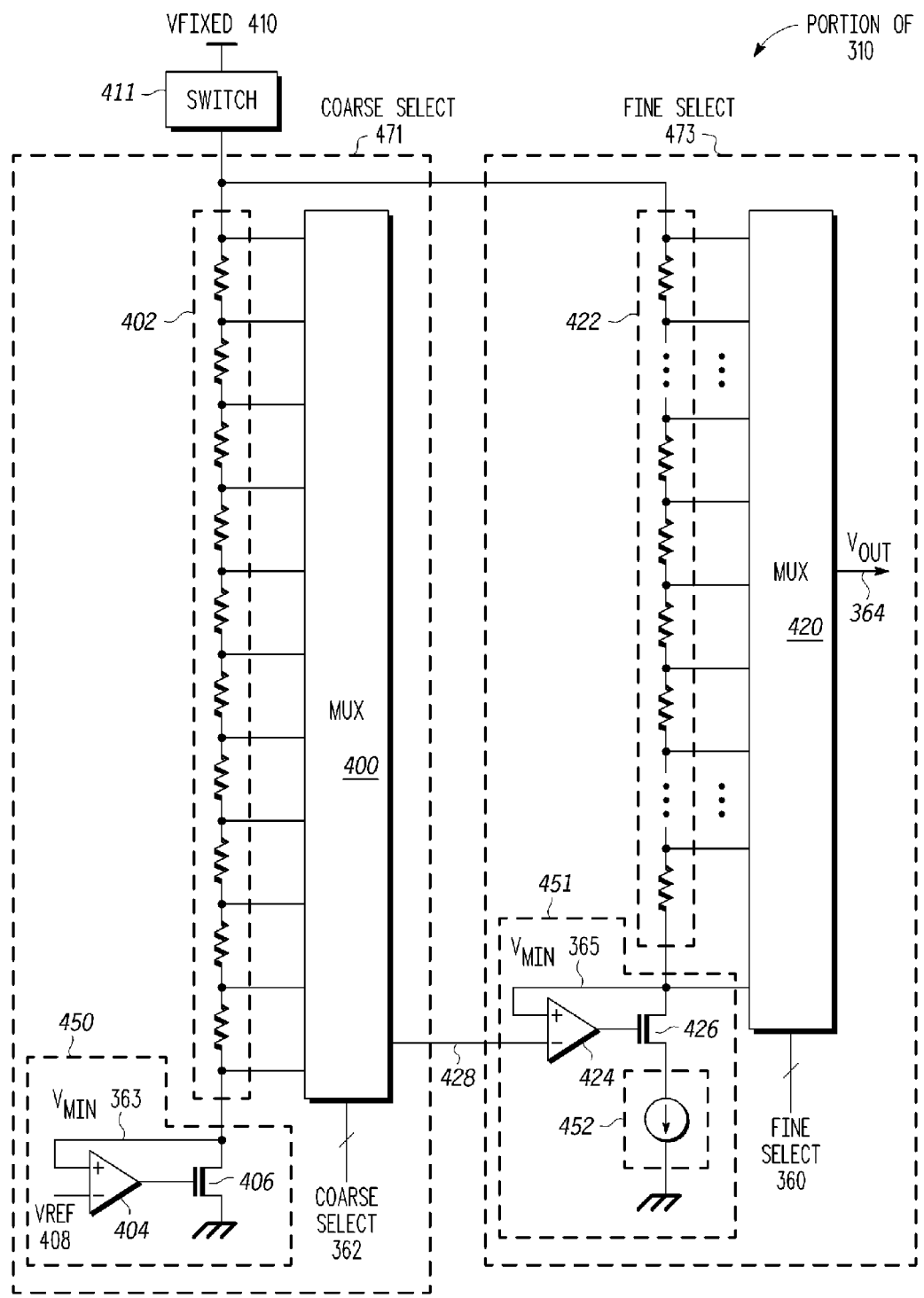
FIG. 4 illustrates, in block diagram form, a portion of an adjustable voltage supply circuit of FIG. 3 in accordance with one embodiment of the present invention.

FIG. 4 illustrates, in block diagram form, a portion of an adjustable voltage supply circuit 310 of FIG. 3 in accordance with one embodiment of the present invention. Circuit 310 comprises a coarse select portion 471 and a fine select portion 473.

The coarse select portion 471 will be described first. Coarse select circuitry 471 comprises a plurality of resistors connected in series to form a resistor ladder 402. Multiplexer (MUX) 400 is coupled to each rung on the resistor ladder 402. Coarse select signal 362 may be used to select one of the rungs or voltages of resistor ladder 402 to be provided as an output 428. Some embodiments may use a switch 411 to reduce power consumption when circuit 310 is not being used. Alternate embodiments may not use a switch 411 but may directly couple the top (first terminal) of the resistor ladder to Vfixed 410. Circuit 450 comprises an operational amplifier (op amp) 404 and an n-channel field effect transistor 406 to generate a minimum coarse voltage Vmin 363. Op amp 404 has an inverting input coupled to receive a voltage Vref 408. Op amp 404 has a non-inverting input which is coupled to the bottom (second terminal) of resistor ladder 402. The top of resistor ladder 402 is coupled to Vfixed 410 by way of a switch 411. The coarse voltage range for the illustrated embodiment ranges from Vmin 363 as the minimum to Vfixed 410 as the maximum. A first current electrode of transistor 406 is coupled to the bottom of resistor ladder 402, a control electrode of transistor 406 is coupled to the output of op amp 404, and the second current electrode of transistor 406 is coupled to a first power supply voltage (e.g. ground). In one embodiment, resistor ladder 402 comprises ten resistors, each having a resistance value of five kilo-ohms. Alternate embodiments may use any number of resistors, each of which has any appropriate value.

The fine select portion 473 will now be described. Fine select circuitry 473 comprises a plurality of resistors connected in series to form a resistor ladder 422. Multiplexer (MUX) 420 is coupled to each rung on the resistor ladder 422. Fine select signal 360 may be used to select one of the rungs or voltages of resistor ladder 422 to be provided as an output Vout 364. Circuit 451 comprises an operational amplifier (op amp) 424 and an n-channel field effect transistor 426 to generate a minimum fine voltage Vmin 365. Op amp 424 has an inverting input coupled to receive a voltage 428 from coarse select circuit 471. Op amp 424 has a non-inverting input which is coupled to the bottom (second terminal) of resistor ladder 422. The top of resistor ladder 422 is coupled to Vfixed 410 by way of a switch 411. The fine voltage range for the illustrated embodiment ranges from Vmin 365 as the minimum to Vfixed 410 as the maximum. A first current electrode of transistor 426 is coupled to the bottom of resistor ladder 422, a control electrode of transistor 426 is coupled to the output of op amp 424, and the second current electrode of transistor 426 is coupled to the first power supply voltage (e.g. ground). Note that for some embodiment, a current source 452 may be coupled between the second current electrode of transistor 426 and the first power supply voltage. Alternate embodiments may not have current source 452. Current source 452 may be used to limit the current through resistor ladder 422 in order to provide power savings and may be used to increase the predictability of the amount of current that Vout 364 may provide to its load. In one embodiment, resistor ladder 422 comprises sixty-four resistors, each having a resistance value of one and one half kilo-ohms. Alternate embodiments may use any number of resistors, each of which has any appropriate value.

As an example, in the illustrated embodiment, if Vfixed 410 is set to 10 volts and Vref 408 is grounded, and the coarse select signal 362 selects a coarse voltage of 4 volts (with a resolution of 1 volt), the fine select signal may select a fine voltage of 5.50 volts in the range between 4 to 10 volts (with a resolution of approximately 0.1 volt), as the output voltage Vout 364. Alternate embodiments may use any desired voltages and voltage ranges. Although the illustrated embodiment only uses two levels of voltage adjustment, alternate embodiments may use any number of levels of voltage adjustment.

Note that the resistive elements in resistor ladders 400 and 422 may be comprised of one or more resistors, transistors (e.g. field effect, bipolar), diodes, switched capacitors, or any other electrical element that can be used to provide a resistance. Note that this circuit 310 may be used in any type of memory. However, circuit 310 may be especially useful for non-volatile memory (e.g. flash memory) which has a charge storage structure where the stored charge affects the voltage threshold.

FIG. 5 illustrates, in flow diagram form, a method in accordance with one embodiment of the present invention. The flow 499 starts at box 500 where a test of flash memory 14 (see FIG. 1) begins. From box 500, the flow 499 proceeds to box 502 where array 300 (see FIG. 3) is erased. From box 502, the flow 499 proceeds to box 504 where specific bitcell locations in array 300 are programmed. Any desired pattern (e.g. all ones, all zeros, checkerboard, diagonal, etc.) may be used to program array 300. Note that in an alternate embodiment, step 504 may not be used if the pattern does not require programming of array 300. From box 504, flow 499 proceeds to box 506 where the maximum voltage for the coarse voltage range and the maximum voltage for the fine voltage range (Vfixed 410) are set to a desired voltage level (see FIG. 4). Note that in alternate embodiments, voltage for the top of resistor ladder 402 may come from an alternate supply.

From box 506, flow 499 proceeds to box 508 where the value of Vmin 363 (see FIG. 4) is selected by adjusting internally generated Vref 408. Vmin 363 and coarse select signal 362 are used to determine the voltage output 428 from the coarse select circuitry 471. From box 508, flow 499 proceeds to box 510 where the value of Vmin 365 (see FIG. 4) is determined by the voltage output 428 from the coarse select circuitry 471. Vmin 365 and fine select signal 360 are used to determine the voltage output Vout 364 from the fine select circuitry 473. From box 510, flow 499 proceeds to box 514 where the bitcells of array 300 are read to determine the conductivity of each bitcell. Note that the voltage Vout 364 (see FIGS. 3 and 4) is used to read the bitcells. From box 514, flow 499 proceeds to box 518 where the number of bitcells that are conductive at this particular Vout 364 is determined. Note that the number of conducting bitcells and the read voltage (Vout 364) may be used to form the erase curve 200. Note that to form the program curve 202, step 518 may also include determining the number of non-conductive bitcells. The number of non-conductive bitcells may be determined by subtracting the number of conductive bitcells from the total number of bitcells in array 300.

From box 518, flow 499 proceeds to decision diamond 520 where the question is asked "are all bitcells conductive?" at this particular Vout 364. If the answer is "yes", then flow 499 proceeds to box 526 where the test is finished. If the answer from decision diamond 520 is "no", then flow 499 proceeds to decision diamond 522 where the question is asked "have all fine voltage levels at this coarse voltage level (428, see FIG. 4) been tested?". If the answer is "no", then flow 499 proceeds to box 516. At box 516, the fine voltage level is adjusted (e.g. using fine select 360, see FIG. 4). From box 516, flow 499 proceeds to box 514. If the answer to decision diamond 522 is "yes", then flow 499 proceeds to box decision diamond 524 where the question is asked "have all coarse voltage levels been tested?". If the answer from decision diamond 524 is "no", then flow 499 proceeds to box 512. At box 512, the coarse voltage level is adjusted (e.g. using coarse select 362, see FIG. 4). From box 512, flow 499 proceeds to box 510. If the answer from decision diamond 524 is "yes", then flow 499 proceeds to box 526 where the test is finished.

In the foregoing specification, the invention has been described with reference to specific embodiments. However, one of ordinary skill in the art appreciates that various modifications and changes can be made without departing from the scope of the present invention as set forth in the claims below. For example, the embodiments described above have been described in the context of memories. However, alternate embodiments may use the method and apparatus described herein in any desired context. Memories are just one possible context. Accordingly, the specification and figures are to be regarded in an illustrative rather than a restrictive sense, and all such modifications are intended to be included within the scope of present invention. Note that the term "couple" has been used to denote that one or more addition conductive elements may be interposed between two elements that are coupled.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A memory comprising:
an array, the array including a plurality of memory cells, each memory cell of plurality of memory cells including a control gate;
decode circuitry including a plurality of outputs coupled to control gates of the memory cells of the plurality of memory cells,
an adjustable voltage supply including an output whose voltage is adjustable, the output of the adjustable supply voltage is coupled to the decode circuitry, wherein the decode circuitry is operable to couple the output of the adjustable voltage supply to control gates of the plurality of memory cells, wherein the adjustable voltage supply includes:
a first resistor ladder having a first plurality of nodes located along the first resistor ladder;
a first multiplexer having a first plurality of inputs and an output, each input of the first plurality of inputs is coupled to a node of the first plurality of nodes of the first resistor ladder, the output of the first multiplexer is coupled to the output of the adjustable voltage supply;
a control input, wherein a voltage of each node of the first plurality of nodes is based upon a voltage received at the control input, wherein the voltage received at the control input is adjustable;
a second resistor ladder having a second plurality of nodes located along the second resistor ladder;
a second multiplexer having a second plurality of inputs, each input of the second plurality of inputs is coupled to a node of the second plurality of nodes, the output of the second multiplexer is coupled to the control input; and
a voltage control circuit coupled to a first node of the first plurality of nodes to control the voltage of a first node of the first plurality of nodes, the voltage control circuit having an input coupled to the control input,
wherein the voltage control circuit comprises an operational amplifier and a transistor, wherein the input of the voltage control circuit is provided to an input of the operational amplifier, wherein an output of the operational amplifier is provided to a control electrode of the transistor, and wherein a current electrode of the transistor is coupled to the first resistor ladder.

2. The memory of claim 1 wherein the adjustable voltage supply further comprises:
a switch circuit coupled to the end node of the second resistor ladder.

3. The memory of claim 2 wherein:
each node of the first plurality of nodes of the first resistor ladder is spaced apart from an adjacent node of the first plurality of nodes of the first resistor ladder by a resistive circuit located in between;
each node of second plurality of nodes of the second resistor ladder is spaced apart from an adjacent node of the second plurality of nodes of the second resistor ladder by a resistive circuit located in between;
the resistor circuits between the nodes of the first plurality of nodes have a smaller resistance value than the resistor circuits between the nodes of the second plurality nodes.

4. The memory of claim 2 wherein:
an end node of the first resistor ladder is connected to the end node of the second resistor ladder.

5. The memory of claim 1 wherein the output of the adjustable voltage supply is coupled to the decode circuitry via a block switch circuit.

6. The memory of claim 1 wherein the output of the adjustable voltage supply is coupled to a well biasing circuit, the well biasing circuit controlling the well bias of the plurality of memory cells.

7. The memory of claim 1 further comprising:
controller including a first set of control outputs for controlling which input of the first multiplexer is connected to the output of the first multiplexer, the controller including a second set of outputs for controlling the decode circuitry;

the controller is configured during a voltage threshold test to provide control signals to the decode circuitry to couple the control gates of the plurality of memory cells to the output of the adjustable voltage circuit and to provide control signals to the first multiplexer to couple, one at a time, nodes of the first plurality of nodes of the first resistor ladder during the voltage threshold test to apply different voltage levels to the control gates of the plurality of memory cells.

8. The memory of claim 1 wherein the memory has a range of read voltage, the range of read voltages has a lower bound, wherein the adjustable voltage supply is coupled to receive a high voltage at an end node of the second resistor ladder, and wherein the high voltage received at the end node of the second resister ladder is greater than twice the lower bound of the range of read voltage of memory.

9. The memory of clam 1 wherein each memory cell of the plurality of memory cells is characterized as a flash memory cell.

10. The memory of claim 1 wherein the first resistor ladder and the second resistor ladder protect the memory from damage due to the high voltage applied at the end node of the second resistor ladder.

11. A circuit comprising:
a first resistor ladder including a first plurality of nodes located along the first resistor ladder; wherein each node of the first plurality of nodes of the first resistor ladder is spaced apart from an adjacent node of the first plurality of nodes of the first resistor ladder by a resistive circuit located in between;
a first multiplexer having a first plurality of inputs, each input of the first plurality of inputs is coupled to a node of the first plurality of nodes of the first resistor ladder;
voltage control circuitry coupled to a second node of the first plurality of nodes to control a voltage of the second node, wherein the voltage of other nodes of the first plurality of nodes of the first resistor ladder is based upon the voltage of the second node, the voltage control circuitry having an input, the voltage of the second node is based upon a voltage received at the input;
a second resistor ladder including a second plurality of nodes, wherein an end node of the first resistor ladder is connected to an end node of the second resistor ladder;
a second multiplexer including a second plurality of inputs, each input of the second plurality of inputs is coupled to a node of the second plurality of nodes, the output of the second multiplexer is coupled to the input of the voltage control circuitry,
wherein the voltage control circuitry comprises an operational amplifier and a transistor, wherein the input of the voltage control circuitry is provided to an input of the operational amplifier, wherein an output of the operational amplifier is provided to a control electrode of the transistor, and wherein a current electrode of the transistor is coupled to the first resistor ladder.

12. The circuit of claim 11 wherein a memory has a range of read voltages, the range of read voltages has a lower bound, wherein the circuit is coupled to receive a high voltage at an end node of the second resistor ladder, and wherein the high voltage received at the end node of the second resistor ladder is greater than twice the lower bound of the range of read voltages of the memory.

13. The circuit of claim 11 wherein the first plurality of inputs is of a greater number than the second plurality of inputs.

14. The circuit of claim 11 wherein the end node of the first resistor ladder and the end node of the second resistor ladder are coupled to an external voltage pin via a switch 15. The circuit of claim 11 wherein the first resistor ladder and second resistor ladder protect the circuit from damage due to the high voltage applied at the end node of the second resistor ladder.

* * * * *